United States Patent [19]

Warman et al.

[11] 3,988,580
[45] Oct. 26, 1976

[54] STORAGE OF INFORMATION

[75] Inventors: Bloomfield James Warman, Wandsworth; Stephen Sidney Walker, Kent, both of England

[73] Assignee: GTE International Incorporated, Stamford, Conn.

[22] Filed: June 12, 1975

[21] Appl. No.: 586,468

[30] Foreign Application Priority Data

July 10, 1974 United Kingdom................ 30641/74

[52] U.S. Cl. .................. 235/153 AM; 340/173 RC; 340/174 ED; 360/53
[51] Int. Cl.² ................... G11C 29/00; H03K 13/34
[58] Field of Search....... 235/153 AM; 340/173 RC, 340/174 ED, 174 SR; 360/53

[56] References Cited
UNITED STATES PATENTS 3,573,728  4/1971  Kolankowsky et al. ..... 235/153 AM
3,859,640  1/1975  Eberlein et al. .......... 340/173 RC X Primary Examiner—R. Stephen Dildine, Jr.

[57] ABSTRACT

An arrangement for applying the bits of a binary coded word to the inputs of respective ones of a first plurality of reiterative digital stores in a predetermined time sequence. A further means is provided for subsequently applying a code of parity bits for the said binary word to the inputs of respective ones of a second plurality of reiterative digital stores in a predetermined time sequence. And also there is a means for causing the word and parity bits to traverse their respective stores in the same sequence.

As a result, the binary data can receive a dual check for correctness.

14 Claims, 3 Drawing Figures

STORAGE OF INFORMATION

BACKGROUND OF THE INVENTION

1. Field of the Invention

This invention relates to information stores and concerns a store for storing information in the form of a binary coded word.

2. Description of the Prior Art

A typical information store is arranged to store information in a binary code word, that is four binary digits or bits for each digit of a decimal number to be stored. It is important to ensure that the stored information remains correct and a simple step which may be taken to improve the reliability of a store is to add a parity bit, so that there are five bits per digit. Such a single parity bit can be used to detect whether there is an error but not what the error is. The next step is to use an error correcting code. This, for a four bit code, uses three extra bits which are generated in such a way that examination of the parity of three selected groups of four bits yields the address of the error. This may be visualized using an example:

| Error Address | 3 | 5 | 6 | 7 | 1 | 2 | 4 |
|---|---|---|---|---|---|---|---|
| Bit Position | 1 | 2 | 3 | 4 | 5 | 6 | 7 |
| | $B_1$ | $B_2$ | $B_4$ | $B_8$ | $P_1$ | $P_2$ | $P_4$ |
| | Binary Code | | | | Parity Bit Code | | |

Each parity bit has a "value" or weighting of 1, 2 or 4 such that an error in error address 3 will result in parity bits 1 and 2 being significant and 4 being non-significant on checking. $P_1$ is the parity for bit positions 1, 2, 4, 5; $P_2$ is the parity for positions 1, 3, 4, 6 and $P_4$ is the parity for positions. 2, 3, 4, 7. The code may now be generated as follows:

| Decimal | $B_1$ | $B_2$ | $B_4$ | $B_8$ | $P_1$ | $P_2$ | $P_4$ |
|---|---|---|---|---|---|---|---|
| 0 | 0 | 0 | 0 | 0 | 0 | 0 | 0 |
| 1 | 1 | 0 | 0 | 0 | 1 | 1 | 0 |
| 2 | 0 | 1 | 0 | 0 | 1 | 0 | 1 |
| 3 | 1 | 1 | 0 | 0 | 0 | 1 | 1 |
| 4 | 0 | 0 | 1 | 0 | 0 | 1 | 1 |
| 5 | 1 | 0 | 1 | 0 | 1 | 0 | 1 |
| 6 | 0 | 1 | 1 | 0 | 1 | 1 | 0 |
| 7 | 1 | 1 | 1 | 0 | 0 | 0 | 0 |
| 8 | 0 | 0 | 0 | 1 | 1 | 1 | 1 |
| 9 | 1 | 0 | 0 | 1 | 0 | 0 | 1 |
| 10 | 0 | 1 | 0 | 1 | 0 | 1 | 0 |
| 11 | 1 | 1 | 0 | 1 | 1 | 0 | 0 |
| 12 | 0 | 0 | 1 | 1 | 1 | 0 | 0 |
| 13 | 1 | 0 | 1 | 1 | 0 | 1 | 0 |
| 14 | 0 | 1 | 1 | 1 | 0 | 0 | 1 |
| 15 | 1 | 1 | 1 | 1 | 1 | 1 | 1 |

$$P_1 = B_1 + B_2 + B_8 \ldots \quad (1)$$

$$P_2 = B_1 + B_4 + B_8 \ldots \quad (2)$$

$$P_4 = B_2 + B_4 + B_8 \ldots \quad (3)$$

and $1 + 0 = 1$ $0 + 0 = 0$ $1 + 1 = 0$

Suppose the number selected for the example is decimal 5. In binary form with the 3-bit parity code this is represented by 1 0 1 0 1 0 1.

Checking the parity:

$B_1 + B_2 + B_8 + P_1 = 0$ $B_1 + B_4 + B_8 + P_2 = 0$ $B_2 + B_4 + B_8 + P_4 = 0$

As in each case the sum is zero the coded information is correct.

Suppose, now that the bit $B_4$, in bit position 3 is changed for example, the number becomes 1 0 0 0 1 0 1, and checking the parity:

$B_1 + B_2 + B_8 + P_1 = 0$ $B_1 + B_4 + B_8 + P_2 = 1$ $B_2 + B_4 + B_8 + P_4 = 1$

Therefore, the error code address is $P_2 + P_4 = 2 + 4$ = Error address 6. Error address 6 is bit position 3 and the digit at this position must therefore be inverted to revert to the original correct information.

The major problem in using the above 3-bit parity code is that only a single error may be detected.

SUMMARY OF THE INVENTION

According to the invention there is provided a store for storing information in the form of a binary word, comprising means for applying the bits of a binary coded word to the inputs of respective ones of a first plurality of reiterative digital stores in a predetermined time sequence, means for subsequently applying a code of parity bits for the said binary word to the inputs of respective ones of a second plurality of reiterative digital stores in a predetermined time sequence, and means for causing the word and parity bits to traverse their respective stores in the same said sequence.

Preferably the store comprises logic means for receiving the binary coded word bits and for deriving the said parity bits from said word bits.

The means may be provided for coupling the word bits to the logic means at substantially the same time and in the same sequence as they are entered into their respective stores.

The logic means may comprise a plurality $x$ of bistable devices each coupled to receive a different group $x$ of word bits out of $y$ word bits, where $y$ and $x$ are the number of the first and second plurality of reiterative stores respectively and be arranged to generate a parity bit according to the sum of the word bits received, and the output of each bistable device is coupled to a respective one of the second plurality of reiterative stores.

The logic means may be responsive to both the word bits and parity bits and be arranged in the absence of parity to detect the address of the reiterative store containing the incorrect bit of information, and to provide an error-correcting signal to correct said incorrect bit of information.

Preferably each parity bit is coupled to its corresponding bistable device at substantially the same time as it is re-read into its store, whereby the output of the bistable device is indicative of parity or the absence of parity in the selected group $x$ of word bits coupled to the bistable device.

Means controlled by said error-correcting signal may be provided for inverting the incorrect bit of information before it is read back into its store to effect said correction.

The outputs of the first plurality of reiterative stores may be coupled to output means by way of a corresponding plurality of delay means, the delay introduced by each delay means being such that the bits of a stored word are presented to the output means substantially simultaneously.

The means for applying the bits of the binary coded word to the first plurality of stores may comprise a digital staticizer.

Preferably the reiterative stores are shift registers and the means for applying the word bits and parity bits to their respective stores in a predetermined sequence comprises timing control means arranged to provide sequential timing signals under the control of a clock pulse generator.

Further according to the invention there is provided a store for the storage of word and parity code bits of a composite error correcting code which enables a single bit error in the composite code to be detected and identified, comprising means for recording each bit of the composite error correcting code in a separate reiterative store so that the composite code is stored in a parallel formation and the word bits of the composite code are read into their respective reiterative stores in separate time slots which are regularly displaced from one another so that the word bits of the composite code are caused to traverse their respective reiterative storage loops serially with respect to one another and to a common repetitive cycle of time slots.

The store according to the preceding paragraph may be arranged to effect single bit error correction comprising means for staticizing an input word code, timing control means for reading the staticized word code bits into their respective reiterative stores in a predetermined sequence, first logic means for deriving a respective code of parity bits from the word code bits as these are read into their respective reiterative stores, each parity bit being significant with respect to a particular sub-group of the word code bits, means for reading the parity code bits into respective reiterative stores in successive sequence to the word code bits and means for sequentially applying the word and parity bits, as these subsequently reappear, in operation at the inputs to their respective stores, to cause said logic means to provide a code output representative of the parities which exist between respective sub-groupings of the word and parity code bits, the store also comprising second logic means, coupled to receive said code output and operable when said code output indicates absence of parity in one or more code bit sub-groups, to translate said code output to a single code bit marking signal corresponding to the word or parity code bit which has been detected as incorrect, and means for inverting said incorrect code bit, when this next appears at the input to the respective reiterative store, to correct the stored word and parity codes.

In the store according to the two immediately preceding paragraphs the reiterative stores may be shift register stores in which code bits are inserted into their respective stores under control of a first cyclically occurring time slot sequence and stepped through the stores under control of a second time slot sequence, the first time slot sequence comprising $n$ time slots while the second comprises $m$ time slots, where $m$ and $n$ integers having no common factor and $m$ is greater than $n$.

Thus by processing the bits of information through the stores in sequence, that is, in different time "slots" a noise burst will not affect more than one bit in any word provided the noise burst is less than a predetermined duration. If the store is considered as a group of seven shift registers, each 100 bits long, the word can be stored as follows:

| Information Bit | Time Slot |
|---|---|
| $B_1$ | 1 |
| $B_2$ | 3 |
| $B_4$ | 5 |
| $B_8$ | 7 |
| $P_1$ | 9 |
| $P_2$ | 11 |
| $P_4$ | 13 |

The time slots may be defined by alternate pulses from a clock pulse source so that a noise pulse would have to have a period exceeding that of two clock pulses to yield two errors in the stored information.

In broad terms, the invention of a store for storing information in the form of a binary word comprises an arrangement for applying the bits of a binary coded word to the inputs of respective ones of a first plurality of reiterative digital stores in a predetermined time sequence. A further means is provided for subsequently applying a code of parity bits for the said binary word to the inputs of respective ones of a second plurality of reiterative digital stores in a predetermined time sequence. And also there is a means for causing the word and parity bits to traverse their respective stores in the same sequence.

As a result, the binary data can receive a dual check for correctness.

BRIEF DESCRIPTION OF THE DRAWING

The invention will now be described by way of example with reference to the accompanying drawings, in which.

DESCRIPTION OF THE PREFERRED EMBODIMENT

Figure 1:
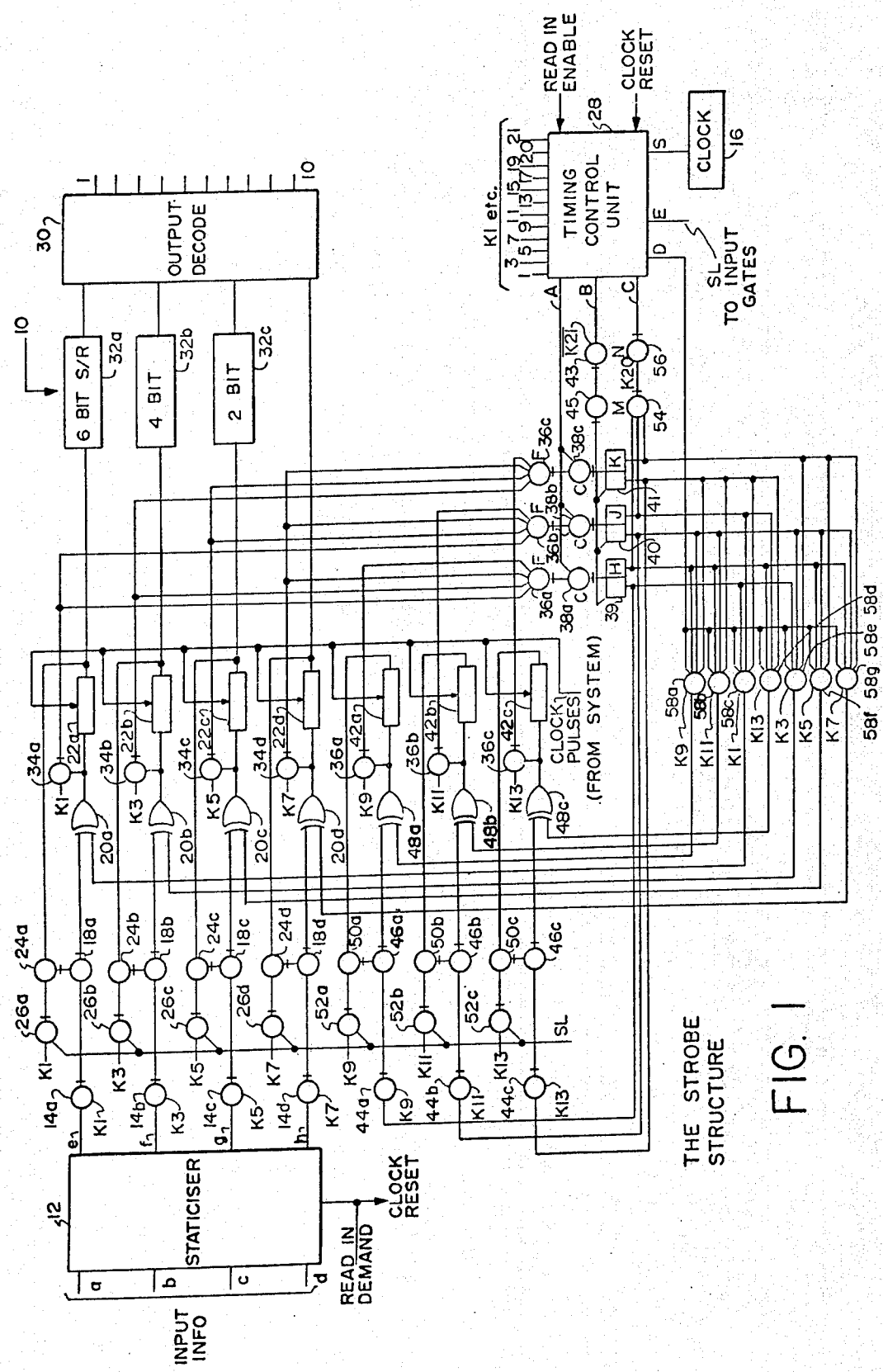
FIG. 1 is a block circuit diagram of an embodiment of an information store according to the invention.
Figure 2:
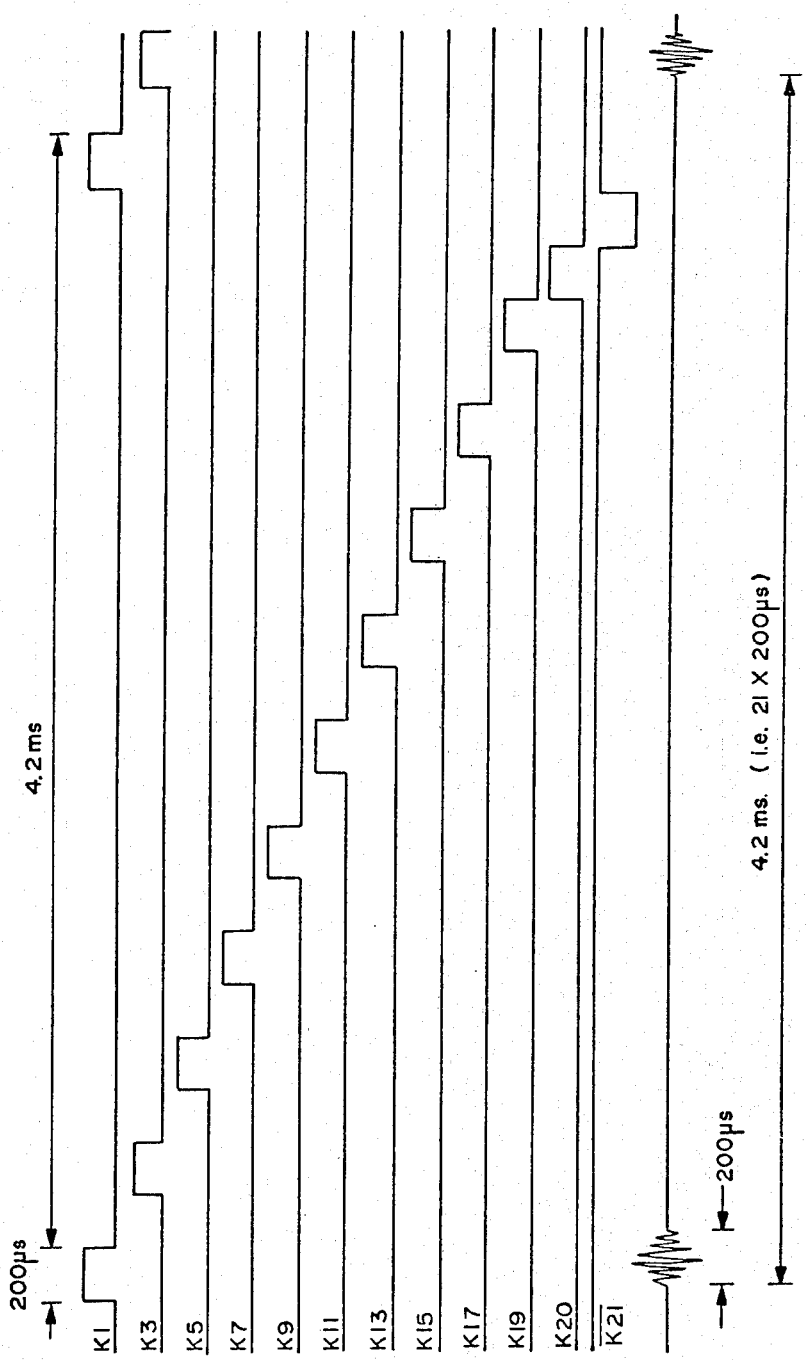
FIG. 2 shows a timing diagram for the store of FIG. 1.

Referring to FIG. 1 there is shown a digital information store 10 for storing information in the form of binary code words. A decimal digit to be stored is applied in binary coded decimal, 1 2 4 8 BCD, form to four inputs 12a – 12d of a binary store, or staticizer 12, the outputs 12e – h of which are coupled to one input of four respective NAND gates 14a – d the other inputs of which are arranged to receive predetermined ones of clock pulses from a clock pulse source 16. In this case the clock source 16 generates pulses of 200 $\mu$ secs. duration these are applied to a timing control unit 28 so arranged that alternate pulses are used to enable the gates 14, that is clock pulse $K_1$ enables gates 14a, $K_3$ enables gate 14b and so on. The output of each gate 14 is coupled through a corresponding NOR gate 18 and an Exclusive OR-gate 20 to the input of a 100-bit shift resister 22.

The output of each shift register 22 is coupled back to its input by way of a recirculating loop including a NAND gate 24 and the second input of gate 18, the NAND gate 24 being enabled by the output of a NAND gate 26. The NAND gates 26 are provided with individual clock pulse inputs $K_1$ or $K_3$ or $K_5$ or $K_7$ as the case may be and a common input which is provided with a "start Loading (SL) command" signal from a timing control circuit 28. The outputs of the shift registers 22a to 22d are also coupled to the four inputs respectively of an output decoder 30 by way of a 6-bit shift register 32a, a 4-bit register 32b and a 2-bit register 32c, respectively, register 22d being coupled directly to its input decoder. The registers 32 effectively delay the outputs from the shift registers 22 so that the four bits of a binary word are presented substantially simultaneously to the decoder 30.

The outputs of Exclusive OR-gates 20 are also coupled by way of a corresponding NAND gate 34 to a selected two out of three NOR gates 36a to c, the outputs of which are coupled through corresponding NAND gates 38a to c to the inputs of J-K flip flops 39, 40, 41. The J-K flip flops 39, 40, 41 receive reset pulses from the timing control unit 28 by way of a NOR gate 43 and NAND gate 45. The NOR gate 43 also has an input coupled to receive a signal corresponding to pulse "NOT K21."

The J-K flip flop 39 is arranged to generate a parity bit $P_1$ according to equation (1), that is:

$$P_1 = B_1 + B_2 + B_8$$

It is arranged therefore to receive input clock signals from gates 20a ($B_1$), 20b ($B_2$), 20d ($B_8$).

Similarly flipflops 40 and 41 generate parity bits $P_2$ and $P_3$ respectively according to equations (2) and (3).

The flip-flops 39, 40 and 41 generate parity bits which are stored in three 100-bit shift registers 42a - c in a manner similar to that described in relation to the storage of the input information in the registers 22. The false output of flip-flop 39 is coupled to one input of a NAND gate 44a, the output of which is coupled through a NAND gate 46a and an Exclusive OR gate 48a to the input of the shift register 42a. The other input of NAND gate 44a is coupled to receive clock pulse $K_9$, that is a clock pulse, two pulses later than that applied to gate 14d. The output of shift register 42a is coupled to its input by way of a loop including a NAND gate 50a the output of which is coupled to the second input of NAND gate 46a. The second input of NAND gate 50a is coupled to the output of a NAND gate 52a which has one input coupled to receive an input of clock pulse $K_9$ and its other input coupled to receive the common "start loading command, SL, signal."

The pulse outputs of flip-flops 40 and 41 are coupled to similar circuits but controlled by clock pulses $K_{11}$ and $K_{13}$ respectively.

The outputs of Exclusive OR gates 48a, b, c are also coupled to an input of a respective NOR gate 36a, b, c to complete the parity equation when checking for errors.

If there is an error in the information stored at the end of an error detection sequence to be described hereinafter, one of the flip-flops 39, 40 or 41 will be set. This is detected by a three input NAND gate 54 having its inputs coupled to the true outputs of the flip-flops and its output is coupled by way of a NAND gate 56 to an input C of the timing control unit 28. The outputs of the flip-flops 39 to 41 are coupled in a predetermined code to seven error connecting NAND gates 58a –g. The gates 58 also have one input coupled to receive a common enabling signal from an output D of the timing control unit 28 and a further input whereby they are clocked sequentially by the clock pulses $K_1$, $K_3$ and so on. For example the gate 58c is clocked by pulse $K_1$ and its output is coupled to provide a correcting signal to the first shift register 22a as will be described hereinafter. The other error correcting gates 58 are coupled in a similar way to a corresponding shift register 22 or 42.

In operation of the store 10, information has first to be entered in the shift register reiterative stores 22 and the parity bits corresponding to that information have to be generated and entered in the shift register reiterative stores 42. Input information in the form of a fourbit binary coded word is presented to the input terminals 12a to d of the staticizer 12 and a "Read Demand" signal is applied to a terminal 12j which causes the information to be stored, sets the main timing to $K_1$ and resets the flip-flops 39 to 41.

The timing control unit 28 provides a "Start-Loading" (SL) command signal at terminal E which inhibits the stored information in any pulse period or time-slot $K_1$ to $K_{13}$ by applying an enable signal to the gates 26 and enables the input information in a time-slot appearing at gates 14. This information is written in to the shift-registers 26 by way of the NOR gates 18 and Exclusive OR gates 20 and is also passed by way of gates 34, 36 and 38 to the J-K flip-flops 39, 40 and 41. Every time a J-K flip-flop receives a negative-going edge of a pulse on its clock input it changes state, the flip-flops having been reset when the main timing was set to $K_1$ by a pulse from output terminal B in the timing control circuit 28. After timing pulse $K_7$ the state of the J-K flip-flops represent the required error code bits. The timing control unit 28 therefore inhibits gates 38 using a signal from terminal A and on succeeding clock pulses $K_9$, $K_{11}$, $K_{13}$, writes the error code into the shift registers 42a to c. Then the timing control unit 28 removes the start loading command signal SL and withdraws the inhibit signal appearing at terminal A and the store 10 continues circulating, as shift pulses for the shift registers continue to be applied by the clock source.

In this embodiment the main timing control uses a 21 phase clock for a store length of 100 bits as 100 and 21 have no common factor. The group of 21 pulses will therefore process through all 100 positions of the store, and will perform an error check for all the information in the store. The period for checking any particular word in the store is equivalent to 21 scans of 100 bits unless an error is found. As will be seen, this involves an extra scan of 100 pulses to effect correction.

With the store circulating, the clock pulses $K_1$ to $K_{21}$ are being generated and are reading the store information serially into the flip-flops 39, 40, 41 by way of gates 34 clocked by their respective clock pulses $K_1$ to $K_{13}$. After pulse $K_{13}$, the J-K flip-flops will all be in the reset state if there is no error in the stored word; this is detected by gate 54, timed by pulse $K_{20}$ in gate 56. If there is no error the timing control unit 28 allows the $\overline{K_{21}}$ pulse in 43 to reset the J-K flip-flops 39, 40, 41. It resets the clock pulses to $K_1$ and checking commences for another word. If there is an error at least one of the J–K flip-flops 39 to 41 will be set after pulse $K_{13}$; this error being detected in the timing control unit by way of gates 54, 56 which switch the unit 28 into the "error correct mode".

When an error in a stored word is detected, the timing control unit 28 inhibits clock outputs $K_1$ to $K_{21}$ and "freezes" the state of the J–K flip-flops 39 to 41 by providing a signal at terminal A to the gates 38. The timing control unit 28 then carries on counting the clock pulses until it reaches 100. It then resets to $K_1$ and enables the clock outputs and the error correcting gates 58 by a signal at output terminal D. Any particular gate 58 is enabled by the combination of the states of the J–K flip flops yielding a code corresponding to the error position, the appropriate clock pulse and the enable signal from terminal D. The stored information appearing on the appropriate Exclusive OR gate 20 is therefore inverted resulting in the error being corrected. At $K_{21}$, the J–K flip-flops are then reset, the timing control unit resets to $K_1$ and error checking continues.

The outputs of the reiterative shift register stores 22a to 22c are coupled through shift registers 32a to 32c of 6, 4, 2 bits in length to the appropriate inputs of the output decoder 30 and the output of store 22d is coupled directly to its input of the decoder 30. Therefore, at the inputs to the decoder 30 at a time corresponding to time slot $K_7$, the information has been "unstaggered" and may be decoded by a simple gate. In some applications of the store this may occur too late and a solution to this is to put the information into the store in a time slot 6 bits earlier than when it will be needed. This can readily be achieved by using a 100 time slot cycle which is advanced six bits with respect to the time slot scanning cycle of the system with which the store 10 is to be used.

Figure 3:
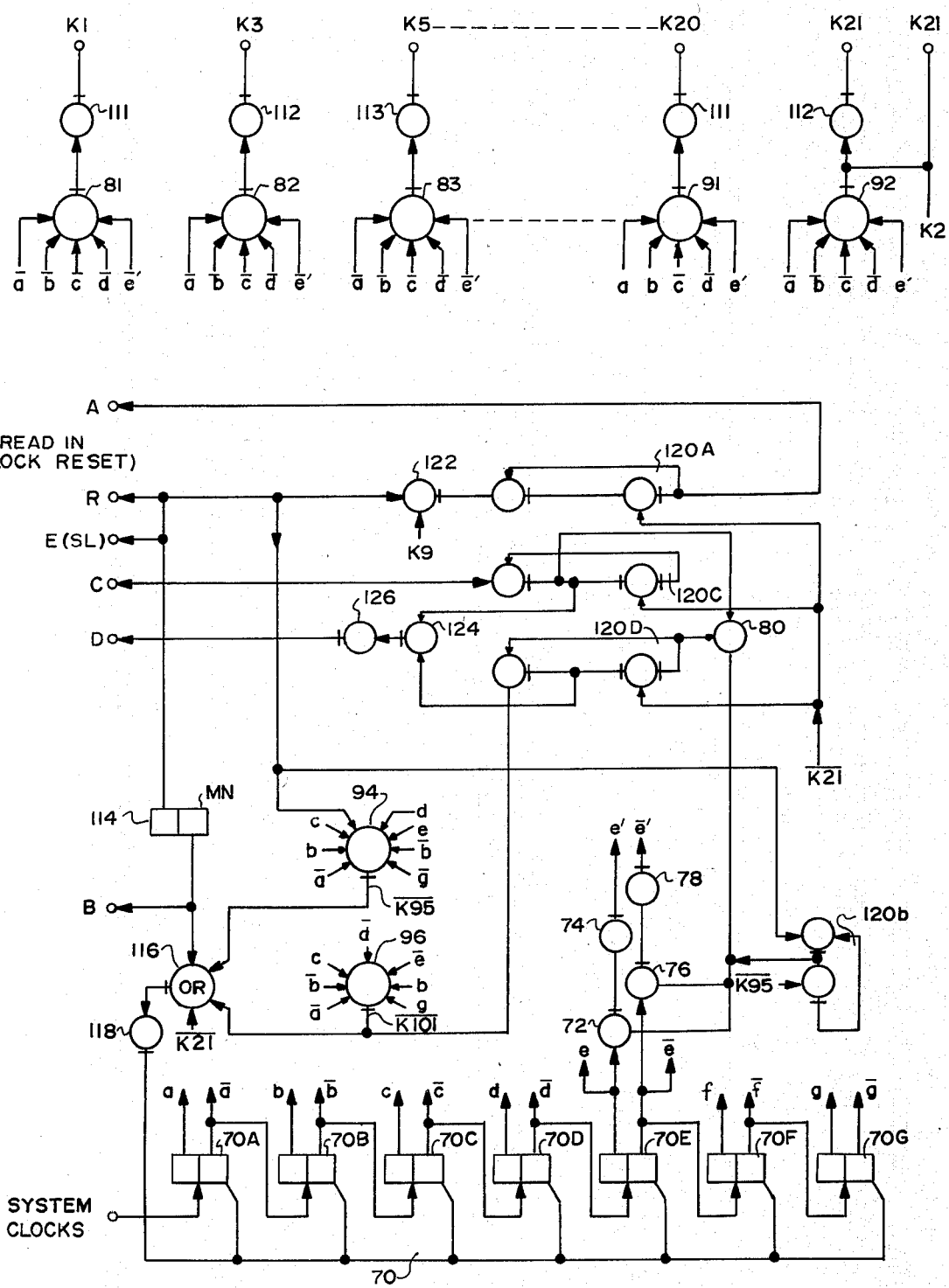
FIG. 3 shows a circuit diagram of a timing control unit for the store of FIG. 1.

The timing control unit 128 shown in FIG. 3 comprises a seven stage binary counter 70 formed by seven interconnected bistable circuits 70A to 70G inclusive. True and false outputs $a, \bar{a}; b, \bar{b};$ etc., are provided from each of the counter bistable circuits. In addition the counter bistable 70E has its true and false outputs connected by way of "NAND" gate and inverter pairs 72, 74 and 76, 78, respectively, to a further pair of true and false outputs designated $e'$ and $\bar{e'}$, respectively, the gates 72 and 76 being enabled from the output of a gate 80 as later described.

Combinations of the true and false outputs from the counter bistables 70A to 70D, together with the true and false outputs $e'$ and $\bar{e'}$ from the inverters 74 and 78 associated with the bistable 70E are connected to the inputs to a group of combining gates 81 – 92, of which only the gates 81, 82, 83, 91 and 92 are shown, so that the gates 81 – 90 and 92 respond to the counter output combinations corresponding to the even counts 0 – 20 inclusive, while the gate 91 responds to the output combination corresponding to the odd count of 19. Also combinations of outputs from each of the bistables 70A to 70G including the outputs, designated $e$ and $\bar{e}$ obtained directly from the counter bistable 70E are connected to NAND gates 94 and 96, the gate 94 being connected to respond to the counter output combination corresponding to the count of 94, and having an additional enabling input connected to it from the "read-in" (Clock reset) terminal R, described below, and the gate 96 being connected to respond to the counter output combination corresponding to the count of 100. The outputs from the gates 81 to 92 are connected over respective inverters 101 to 112 to the timing pulse output terminals, designated K1, K3, K5 . . . K20, K21. The output from gate 92 is also connected directly to the output terminal $\overline{K21}$, and internally of the timing control element to provide re-setting functions later described. The outputs from the gates 94 and 96 are similarly designated $\overline{K95}$ and $\overline{K101}$ and these outputs together with the timing pulse output $\overline{K21}$ and the output from a resetting monostable circuit 114 are gated in a "NOR" gate 116, the output from which is inverted in an inverter 118 and applied to re-set the counter 70.

The timing control unit also comprises NAND gate pairs interconnected in wellknown manner to form toggle bistable circuits 120A, 120B, 120C and 120D. The bistable 120A has its setting input connected by way of a gate 122, which has an enabling input connected to the timing pulse output K9 to the "read-in" (clock reset) terminal R and when set, applies an output signal to the control unit terminal A, to inhibit the error checking bistables 39, 40, 41 (FIG. 1). The bistable 120B has its setting input connected to the "read-in" terminal R and when set, applies an inhibiting input to the gates 72 and 76, to enable information to be loaded into the store, six time slots earlier than required to allow the simple decoding using the time delay elements described with reference to FIG. 1. The bi-stable 120C has its setting input directly connected to the control unit terminal C and when set, in response to an error detection signal from the circuit of FIG. 1, applies an input signal to gate 80, to cause the latter to apply an inhibiting signal to the gates 72 and 76, and also applies a signal to prime a gate 124. The bistable 120D has its setting input connected to the output K101, from gate 96 and when set applies an enabling signal to gate 124, whose output is connected by way of an inverter 126 to the control unit terminal D, and also applies an input signal to gate 80, causing the latter to remove its inhibiting input to gates 72 and 76. The bistables 120A, 120C and 120D are reset from the timing pulse output $\overline{K21}$ while the bistable 120B is reset from the gate 94 output $\overline{K95}$.

In operation of the timing control unit 28, a read-in signal arriving at terminal R is applied directly to terminal E to provide the "start loading" signal SL to the gates 26 and 52 (FIG. 1). The read-in signal is also applied to the monostable element 114 to cause the latter to apply a re-setting output pulse to terminal B to re-set the error correcting bistables 39, 40, 41 (FIG. 1) and, by way of the "OR" gate 116 and inverter 118 to re-set the counter 70. The read-in signal is also applied to prime the combining gate 94, to set the bistable 120B.

The bistable 120B setting applies an inhibiting signal to the gates 72 and 76, thereby inhibiting the timing pulse outputs K1–K21 and $\overline{K21}$. In this condition the counter 70, under control of the system clock pulse source S, proceeds to count to 94, when the gate 94 operates to apply a resetting signal via gate 116 and inverter 118 to again reset the counter 70. The output $\overline{K95}$ resets the bistable 120B, removing the inhibition from the gates 72 and 76, and from the timing pulse outputs. The counter 70 continues its counting action and timing pulse outputs now appear at the output terminals K1–K21, and $\overline{K21}$, thereby allowing the information to be read from the staticizer to the circulating stores (FIG. 1) at times K1, K3, K5 and K7. At time K9, the gate 122 is enabled from the read-in signal to set the bistable 120A to apply the inhibiting signal to terminal A, to inhibit the error checking bistables 39, 40, 41 (FIG. 1). The counter now continues to count through the five counter bistables 70A to 70E and is reset each time the time pulse output $\overline{K21}$ appears.

If an error is detected by the apparatus of FIG. 1, an error signal applied to terminal C sets the bistable 120C which as previously described causes gate 80 to inhibit the time pulse outputs K1–K21 and $\overline{K21}$ via gates 72 and 76. The counter now proceeds to count to 100, when the gate 91 operates to apply a resetting pulse via gate 116 and inverter 118 to reset the counter 70, and to apply a setting pulse to set the bistable 120D. With bistables 120C and 120D both set, the gate 124 is enabled to apply a signal via inverter 126, and terminal D to enable the error correcting gates 58 of FIG. 1.

A store according to the invention may find application, for example, in a time division multiplex controlled telephone exchange switching system where a relatively long period of storage is required.

What is claimed is:

1. A store for storing information in the form of a binary word, comprising means for applying the bits of a binary coded word to the inputs of respective ones of a first plurality of reiterative digital stores in a predetermined time sequence, logic means for receiving the binary coded word bits, means for coupling the word bits to the logic means substantially at the same time and in the same sequence as they are entered into their respective stores, a second plurality of reiterative digital stores, said logic means comprising a plurality $x$ of bistable devices each coupled to receive a different group $x$ of word bits out of $y$ word bits where $y$ and $x$ are the number of the first and second plurality of reiterative stores respectively and arranged to generate a parity bit according to the sum of the word bits received, and the output of each bistable device is coupled to a respective one of the second plurality of reiterative stores, in a predetermined time sequence and means for causing the word and parity bits to traverse their respective stores in the same said sequences.

2. A store according to claim 4, wherein the logic means is responsive to both the word bits and parity bits and is arranged in the absence of parity to detect the address of the reiterative store containing the incorrect bit of information, and to provide an error-correcting signal to correct said incorrect bit of information.

3. A store according to claim 2, in which each parity bit is coupled to its corresponding bistable device at substantially the same time as it is read into its store, whereby the output of the bistable device is indicative of parity or the absence of parity in the selected group $x$ of word bits coupled to the bistable device.

4. A store according to claim 3, comprising means controlled by said error-correcting signal for inverting the incorrect bit of information before it is read back into its store to effect said correction.

5. A store according to claim 4, in which the outputs of the first plurality of reiterative stores are coupled to output means by way of a corresponding plurality of delay means, the delay introduced by each delay means being such that the bits of a stored word are presented to the output means substantially simultaneously.

6. A store according to claim 5, in which the output means is a binary to decimal decoder.

7. A store according to claim 6, in which the means for applying the bits of the binary coded word to the first plurality of stores comprises a digital staticizer.

8. A store according to claim 7, wherein the reiterative stores are shift registers and the means for applying the word bits and parity bits to their respective stores in a predetermined sequence comprises timing control means arranged to provide sequential timing signals under the control of a clock pulse generator.

9. A store according to claim 8, in which the word bits and parity bits are coupled to their respective reiterative stores by way of corresponding gates arranged to be opened by the said timing signals.

10. A store according to claim 9, in which the timing signals are derived from alternate pulses of the clock pulse source.

11. A store according to claim 10, in which the word bits and parity bits are inserted into their respective stores under control of a first cyclically occurring timeslot sequence and are stepped through the stores under control of a second time slot sequence, the first time slot sequence comprising $n$ time slots while the second comprises $m$ time slots, where $m$ and $n$ are integers having no common factor and $m$ is greater than $n$.

12. A store for the storage of word and parity code bits of a composite error correcting code which enables a single bit error in the composite code to be detected and identified, comprising means for recording each bit of the composite error correcting code in a separate reiterative store so that the composite code is stored in a parallel formation and the word bits of the composite code are read into their respective reiterative stores in separate time slots which are regularly displaced from one another so that the word bits of the composite code are caused to traverse their respective reiterative storage loops serially with respect to one another and to a common repetitive cycle of time slots.

13. A store according to claim 12, arranged to effect single bit error correction comprising means for staticizing an input word code, timing control means for reading the staticized word code bits into their respective reiterative stores in a predetermined sequence, first logic means for deriving a respective code of parity bits from the word code bits as these are read into their respective reiterative stores, each parity bit being significant with respect to a particular sub-group of the word code bits, means for reading the parity code bits into respective reiterative stores in successive sequence to the word code bits and means for sequentially applying the word and parity bits, as these subsequently reappear, in operation, at the inputs to their respective stores, to cause said logic means to provide a code output representative of the parities which exist between respective sub-groupings of the word and parity code bits, the store also comprising second logic means, coupled to receive said code output and operable when said code output indicates absence of parity in one or more code bit sub-groups, to translate said code output to a single code bit marking signal corresponding to the word or parity code bit which has been detected as incorrect, and means for inverting said incorrect code bit, when this next appears at the input to the respective reiterative store, to correct the stored word and parity codes.

14. A store according to claim 13, in which the reiterative stores are shift register stores in which code bits are inserted into their respective stores under control of a first cyclically occurring time slot sequence and are stepped through the stores under control of a second time slot sequence, the first time slot sequence comprising $n$ time slots while the second comprises $m$ time slots, where $m$ and $n$ are integers having no common factor and $m$ is greater than $n$.

* * * * *